(12) United States Patent
Yoneda et al.

(10) Patent No.: US 7,696,593 B2
(45) Date of Patent: Apr. 13, 2010

(54) PIN-TYPE PHOTO DETECTING ELEMENT WITH THREE SEMICONDUCTOR LAYERS, AND WINDOW SEMICONDUCTOR LAYER HAVING CONTROLLED THICKNESS

(75) Inventors: Yoshihiro Yoneda, Yamanashi (JP); Ryuji Yamabi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 104 days.

(21) Appl. No.: 11/771,588

(22) Filed: Jun. 29, 2007

(65) Prior Publication Data

US 2008/0001245 A1    Jan. 3, 2008

(30) Foreign Application Priority Data

Jun. 30, 2006    (JP)    ................. 2006-182325

(51) Int. Cl.
*H01L 31/0304*    (2006.01)
*H01L 31/0264*    (2006.01)

(52) U.S. Cl. ................. 257/458; 257/184; 257/431; 257/433; 257/434; 257/E31.022; 257/E31.019; 257/E31.004

(58) Field of Classification Search ................. 257/458, 257/184, 431, 433, 434, E31.022, E31.019, 257/E31.004
See application file for complete search history.

(56) References Cited

U.S. PATENT DOCUMENTS

| | | | |
|---|---|---|---|
| 4,453,173 A * | 6/1984 | Carlson et al. ................. 257/53 |
| 5,712,504 A * | 1/1998 | Yano et al. .................... 257/452 |
| 6,065,418 A * | 5/2000 | Goldstein et al. ............ 114/312 |
| 6,690,079 B2 * | 2/2004 | Fujimura et al. ............. 257/460 |
| 7,332,758 B2 * | 2/2008 | Yamabi et al. ............... 257/292 |
| 2004/0102000 A1 * | 5/2004 | Leng et al. ................... 438/197 |

FOREIGN PATENT DOCUMENTS

JP    9-213988 A    8/1997

\* cited by examiner

*Primary Examiner*—Wai-Sing Louie
*Assistant Examiner*—Diana C Garrity
(74) *Attorney, Agent, or Firm*—Westerman, Hattori, Daniels & Adrian, LLP

(57) ABSTRACT

A semiconductor photo detecting element includes a PIN-type photo detecting element and window semiconductor layer. The PIN-type photo detecting element has a semiconductor substrate, a first semiconductor layer, a second semiconductor layer and a third semiconductor layer. The first semiconductor layer is provided on the semiconductor substrate, is lattice-matched to the semiconductor substrate, includes a first conductivity type dopant, and has first band gap energy. The second semiconductor layer is provided on the first semiconductor layer, has the first band gap energy, and has a concentration of the first conductivity type dopant lower than that of the first semiconductor layer or is substantially undoped. The third semiconductor layer is provided on the second semiconductor layer. The window semiconductor layer has second band gap energy larger than the first band gap energy at a light-incoming side with respect to the second semiconductor layer and has a thickness of 5 nm to 50 nm.

10 Claims, 13 Drawing Sheets

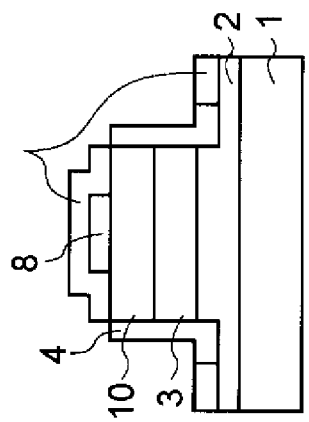
FIG. 5A
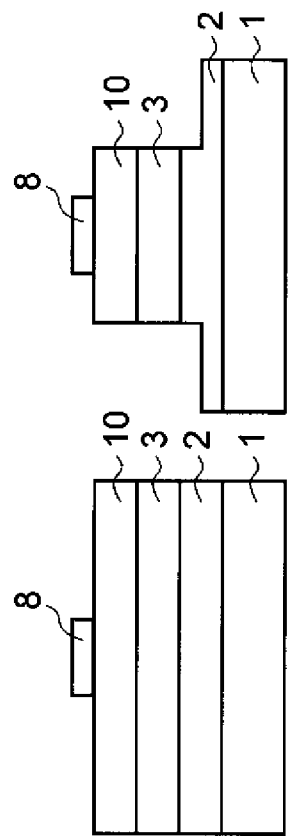
FIG. 5B
FIG. 5C
FIG. 5D
SELECTIVE GROWTH MASK
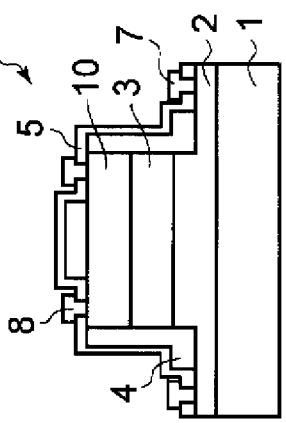
FIG. 5E
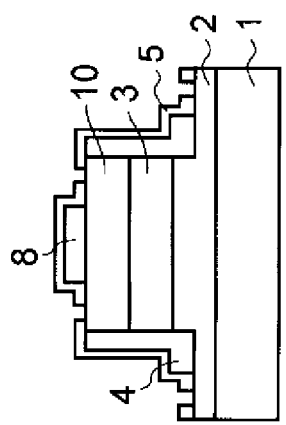
FIG. 5F

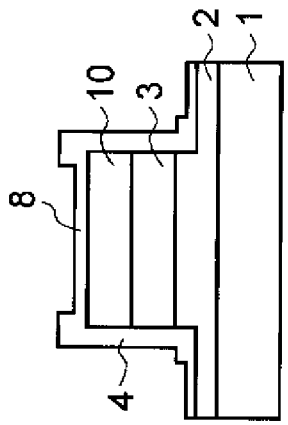
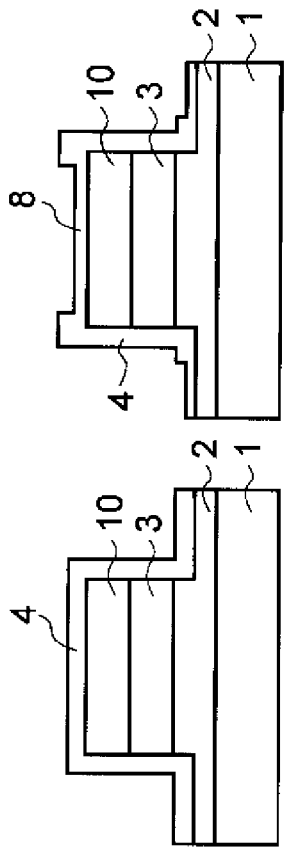
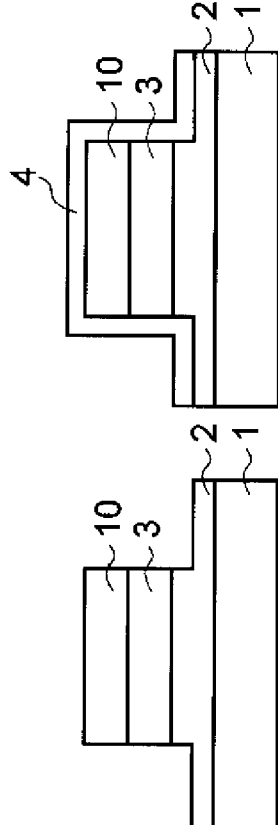
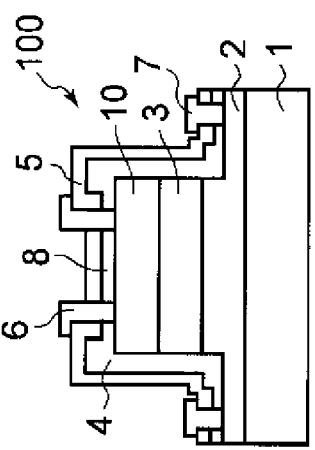
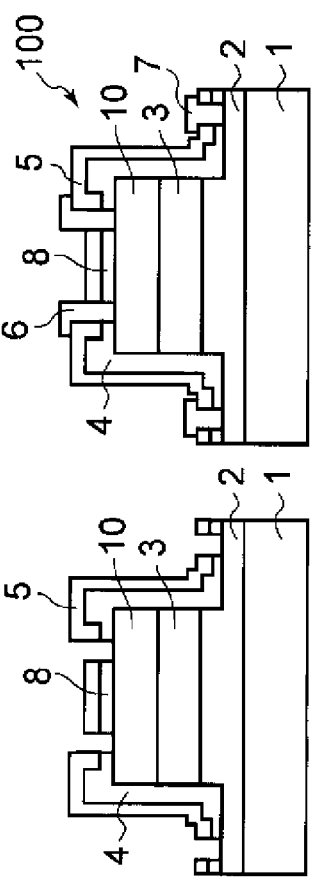
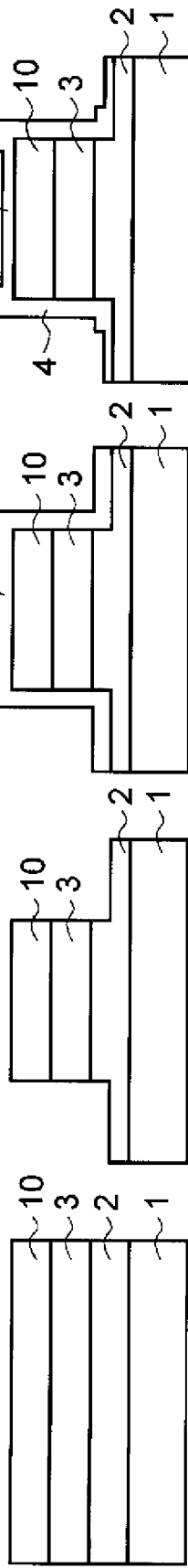

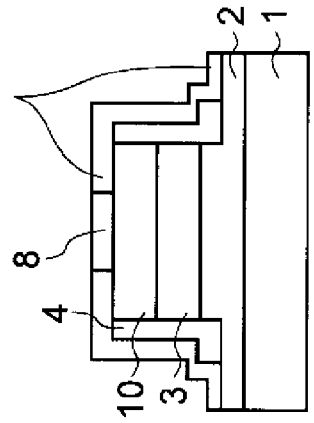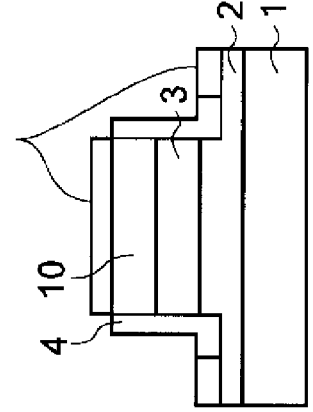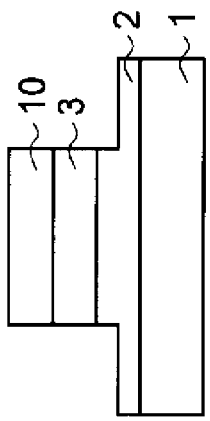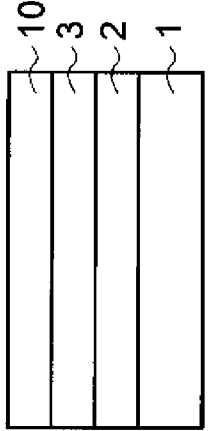

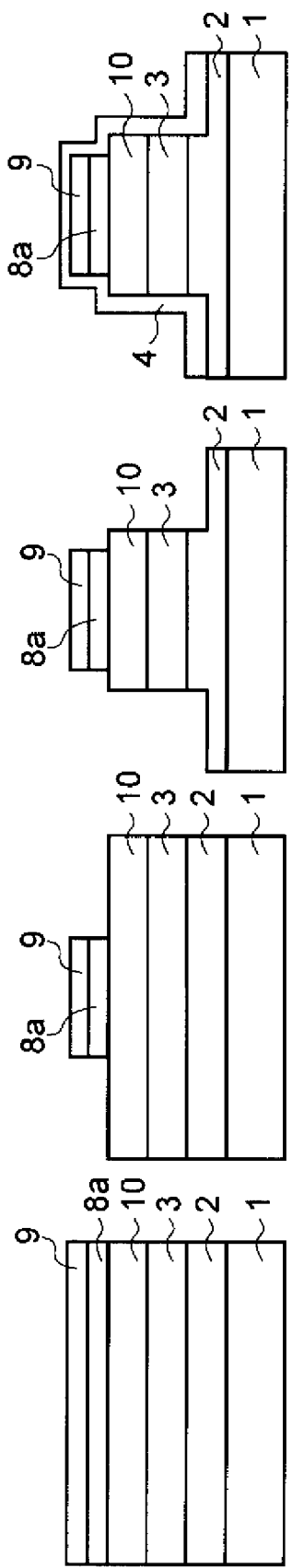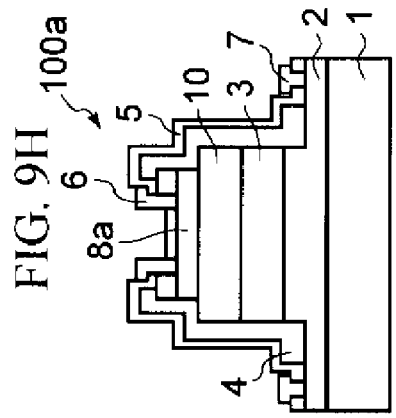

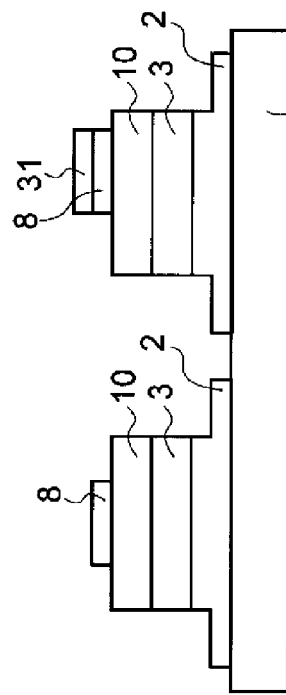
FIG. 13B
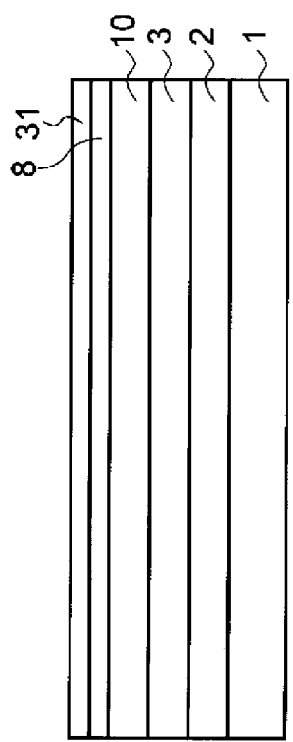
FIG. 13D
FIG. 13A
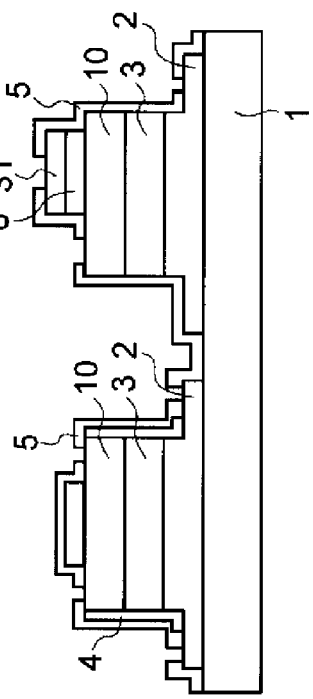
FIG. 13C
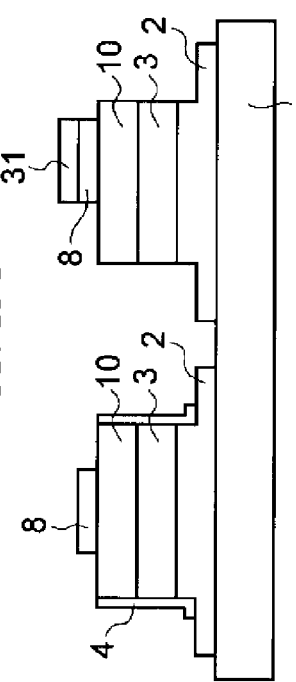
FIG. 13E
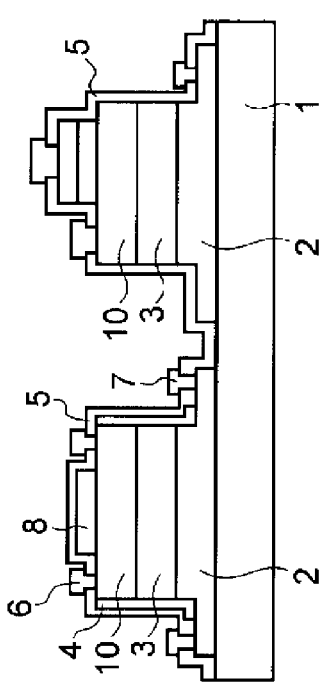

PIN-TYPE PHOTO DETECTING ELEMENT WITH THREE SEMICONDUCTOR LAYERS, AND WINDOW SEMICONDUCTOR LAYER HAVING CONTROLLED THICKNESS

BACKGROUND OF THE INVENTION

1. Field of the Invention

This invention generally relates to a semiconductor photo detecting element, a manufacturing method of the same, and a manufacturing method of an optoelectronic integrated circuit.

2. Description of the Related Art

An optoelectronic integrated circuit has a structure in which a photo detecting element such as a PIN-type photo diode (PIN-PD) and an electronic element such as a hetero junction bipolar transistor (HBT) are integrated monolithically on a same substrate. A PIN-type photo detecting element has mainly a mesa shape in order to be integrated easily with an electronic device element. For example, Japanese Patent Application Publication No. 9-213988 (hereinafter referred to as Document 1) discloses a PIN-type photo detecting element having a structure in which a PIN-type photo-diode composed of InGaAs is provided on an InP substrate and a protective layer composed of InP is provided.

The photo detecting element in accordance with Document 1 is effective with respect to a signal light having a long wavelength range of 1260 nm to 1620 nm mainly used in an optical fiber communication system, because the protective layer composed of InP has a wide transparent wavelength range at a long wavelength side. Here, InP has absorption property in a short wavelength range less than 0.92 μm that is band gap energy thereof. Therefore, most of the signal light is absorbed at the InP protective layer, in a communication system using a multi mode fiber and a signal wavelength of 850 nm. As a result, sufficient responsivity property is not obtained. This is because a carrier generated in the InP protective layer may not move toward the photo detecting element because of an energy barrier between the photo detecting element and the InP protective layer and the carrier generated in the InP protective layer may not contribute to responsivity.

Recently, there is a demand for speeding up and advancing (downsizing and reducing a cost of) a short wavelength communication system using a signal of 850 nm. Conventionally, a silicon photo diode is used in a communication system using a signal wavelength of 850 nm.

However, it is difficult to control a thickness of a light-absorbing layer (Si) of the silicon photo diode. Therefore, there is a limitation in the speeding up of the silicon photo-diode. It may not be possible to integrate the silicon photo-diode with an InP type electronic device achieving speed-up (for example, a hetero bipolar transistor), because each of the materials is different from each other.

InGaAs has an unstable surface because band gap energy of the InGaAs is small. In this case, it is difficult to protect the surface of the InGaAs with a dielectric layer such as SiN. Therefore, there are many trap energy levels of a generated carrier on the surface of InGaAs. In particular, responsivity with respect to a signal light of a short wavelength range having a high absorption coefficient is reduced because or the surface trap.

SUMMARY OF THE INVENTION

The present invention provides a photo detecting element having high quantum efficiency with respect to a short wavelength range (for example less than 0.92 μm), a manufacturing method of the photo detecting element and a manufacturing method of an optoelectronic integrated circuit.

According to an aspect of the present invention, preferably, there is provided a semiconductor photo detecting element including a PIN-type photo detecting element and a window semiconductor layer. The PIN-type photo detecting element has a semiconductor substrate, a first semiconductor layer, a second semiconductor layer and a third semiconductor layer. The first semiconductor layer is provided on the semiconductor substrate, is lattice-matched to the semiconductor substrate, includes a first conductivity type dopant, and has first band gap energy. The second semiconductor layer is provided on the first semiconductor layer, has the first band gap energy, and has a concentration of the first conductivity type dopant lower than that of the first semiconductor layer or is substantially undoped. The third semiconductor layer is provided on the second semiconductor layer. The window semiconductor layer has second band gap energy larger than the first band gap energy at a light-incoming side with respect to the second semiconductor layer and has a thickness of 5 nm to 50 nm.

With the above-mentioned configuration, a light passing through the window semiconductor layer is received in the first through the third semiconductor layers. When the window semiconductor layer has a thickness of less than 50 nm, the number of a generated carrier is reduced in the window semiconductor layer, the generated carrier not being influential to responsivity with respect to an incoming-light of a short wavelength range. When the window semiconductor layer has a thickness of more than 5 nm, there is generated little surface trap not influential to the responsivity with respect to the incoming-light of the short wavelength range. Therefore, the number of a generated carrier is increased and quantum efficiency is improved, the generated carrier being in the first through the third semiconductor layers and contributing to responsivity. Accordingly, the semiconductor photo detecting element achieves high quantum efficiency with respect to not only a conventional incoming-light of the conventional long wavelength range but also the incoming-light of the short wavelength range.

According to another aspect of the present invention, preferably, there is provided a manufacturing method of a semiconductor photo detecting element including arranging a first semiconductor layer, a second semiconductor layer, a third semiconductor layer and a fourth semiconductor layer on a semiconductor substrate in order, exposing a side face of the first through the third semiconductor layers with an etching treatment, masking an upper face of the fourth semiconductor layer and an exposed face of the third semiconductor layer, and forming a fifth semiconductor layer on the side face of the first through the third semiconductor layers. The first semiconductor layer is lattice-matched to the semiconductor substrate, includes a first conductivity type dopant, and has first band gap energy. The second semiconductor layer has the first band gap energy, and has a concentration of the first conductivity type dopant lower than that of the first semiconductor layer or is substantially undoped. The third semiconductor layer includes a second conductivity type dopant different from the first conductivity type dopant and has the first band gap energy. The fourth semiconductor layer has second band gap energy larger than the first band gap energy. The fifth semiconductor layer has the second band gap energy. The fourth semiconductor layer has a thickness of 5 nm to 50 nm.

With the manufacturing method, it is not necessary to grow another semiconductor layer on the fourth semiconductor layer, because the fourth semiconductor layer is formed in the first growth process and the fifth semiconductor layer is grown only on the side face of the first through the third semiconductor layers after the fourth semiconductor layer is protected. In this case, a regrown interface is not formed on the fourth semiconductor layer. Therefore, the fourth semiconductor layer may be used as a photo detecting window not having a surface trap. And, when the fourth semiconductor layer has a thickness of less than 50 nm, the number of a generated carrier is reduced in the fourth semiconductor layer, the generated carrier not being influential to responsivity with respect to an incoming-light of a short wavelength range. When the fourth semiconductor layer has a thickness of more than 5 nm, there is generated little surface trap not influential to the responsivity with respect to the incoming-light of the short wavelength range. Therefore, the number of a generated carrier is increased and quantum efficiency is improved, the generated carrier being in the first through the third semiconductor layers and influencing responsivity. Accordingly, the semiconductor photo detecting element achieves high quantum efficiency with respect to not only an incoming-light of the conventional long wavelength range but also the incoming-light of the short wavelength range.

According to another aspect of the present invention, preferably, there is provided a manufacturing method of a semiconductor photo detecting element including arranging a first semiconductor layer, a second semiconductor layer and a third semiconductor layer on a semiconductor substrate in order, exposing a side face of the first through the third semiconductor layers with an etching treatment, forming a fourth semiconductor layer covering the side face of the first through the third semiconductor layers and an upper face of the third semiconductor layer, and performing a selective etching treatment to the fourth semiconductor layer on the third semiconductor layer. The first semiconductor layer is lattice-matched to the semiconductor substrate, includes a first conductivity type dopant, and has first band gap energy. The second semiconductor layer has the first band gap energy, and has a concentration of the first conductivity type dopant lower than that of the first semiconductor layer or is substantially undoped. The third semiconductor layer includes a second conductivity type dopant different from the first conductivity type dopant and has the first band gap energy. The fourth semiconductor layer has second band gap energy larger than the first band gap energy. The fourth semiconductor layer on the third semiconductor layer has a thickness of 5 nm to 50 nm.

With the manufacturing method, it is possible to form the fourth semiconductor layer on the upper face of the third semiconductor layer and the fourth semiconductor layer on the side face of the first through the third semiconductor layers in one process. Therefore, the manufacturing process is simplified. And it is not necessary to grow another semiconductor layer on the fourth semiconductor layer. In this case, a regrown interface is not formed on the fourth semiconductor layer. Therefore, the fourth semiconductor layer may be used as a photo detecting window having a sensitive face. And, when the fourth semiconductor layer on the third semiconductor layer has a thickness of less than 50 nm, the number of a generated carrier is reduced in the fourth semiconductor layer, the generated carrier not being influential to responsivity with respect to an incoming-light of a short wavelength range. When the fourth semiconductor layer on the third semiconductor layer has a thickness of more than 5 nm, there is generated little surface trap not influential to the responsivity with respect to the incoming-light of the short wavelength range. Therefore, the number of a generated carrier is increased and quantum efficiency is improved, the generated carrier being in the first through the third semiconductor layers and influencing responsivity. Accordingly, the semiconductor photo detecting element achieves high quantum efficiency with respect to not only an incoming-light of the conventional long wavelength range but also the incoming-light of the short wavelength range.

According to another aspect of the present invention, preferably, there is provided a manufacturing method of a photo detecting element including arranging a first semiconductor layer, a second semiconductor layer and a third semiconductor layer on a semiconductor substrate in order, exposing a side face of the first through the third semiconductor layers with an etching treatment, masking an upper face of the third semiconductor layer and a part of an exposed face of the first semiconductor layer, forming a fourth semiconductor layer on the side face of the first through the third semiconductor layers, and forming a fifth semiconductor layer. The first semiconductor layer is lattice-matched to the semiconductor substrate, includes a first conductivity type dopant, and has first band gap energy. The second semiconductor layer has the first band gap energy, and has a concentration of the first conductivity type dopant lower than that of the first semiconductor layer or is substantially undoped. The third semiconductor layer includes a second conductivity type dopant different from the first conductivity type dopant and has the first band gap energy. The fourth semiconductor layer has second band gap energy larger than the first band gap energy. The fifth semiconductor layer has the second band gap energy on the third semiconductor layer, and has a thickness of 5 nm to 50 nm.

With the manufacturing method, a thermal influence to the fifth semiconductor layer is reduced in a following process, because the fifth semiconductor layer is formed after growing the fourth semiconductor layer on the side face of the first through the third semiconductor layers. That is, the fifth semiconductor layer is not subjected to a process of epitaxial growth of a semiconductor layer of which temperature is the highest in the manufacturing process. And it is not necessary to grow another semiconductor layer on the fifth semiconductor layer. In this case, a regrown interface is not formed on the fifth semiconductor layer. Therefore, the fifth semiconductor layer may be used as a photo detecting window having a sensitive face. And, when the fifth semiconductor layer has a thickness of less than 50 nm, the number of a generated carrier is reduced in the fifth semiconductor layer, the generated carrier not being influential to responsivity with respect to an incoming-light of a short wavelength range. When the fifth semiconductor layer has a thickness of more than 5 nm, there is generated little surface trap not influential to the responsivity with respect to the incoming-light of the short wavelength range. Therefore, the number of a generated carrier is increased and quantum efficiency is improved, the generated carrier being in the first through the third semiconductor layers and influencing responsivity. Accordingly, the semiconductor photo detecting element achieves high quantum efficiency with respect to not only an incoming-light of the conventional long wavelength range but also the incoming-light of the short wavelength range.

According to another aspect of the present invention, preferably, there is provided a manufacturing method of an optoelectronic integrated circuit including arranging a first semiconductor layer, a second semiconductor layer, a third semiconductor layer, a fourth semiconductor layer and a fifth semiconductor layer on a semiconductor substrate in order, forming a photo detecting region from a first mesa composed of the first through the fourth semiconductor layers and forming a transistor region from a second mesa composed of the first through the fifth semiconductor layers, and forming a sixth semiconductor layer on a side face of the first through the third semiconductor layers in the first mesa. The first semiconductor layer is lattice-matched to the semiconductor substrate, includes a first conductivity type dopant, and has first band gap energy. The second semiconductor layer has the first band gap energy, and has a concentration of the first conductivity type dopant lower than that of the first semiconductor layer or is substantially undoped. The third semiconductor layer includes a second conductivity type dopant different from the first conductivity type dopant and has the first band gap energy. The fourth semiconductor layer has second band gap energy larger than the first band gap energy. The fifth semiconductor layer includes the first conductivity type dopant and has the first band gap energy. The fourth semiconductor layer has a thickness of 5 nm to 50 nm. The sixth semiconductor layer has the second band gap energy.

With the manufacturing method, it is possible to share the first through the fourth semiconductor layers in the photo detecting element and the first through the fourth semiconductor layers in the electronic element. And it is possible to commoditize the processes of forming the photo detecting element and forming the electronic device element. And it is possible to simplify the integrating process. And, when the fourth semiconductor layer has a thickness of less than 50 nm, the number of a generated carrier is reduced in the fourth semiconductor layer, the generated carrier not being influential to responsivity with respect to an incoming-light of a short wavelength range. When the fourth semiconductor layer has a thickness of more than 5 nm, there is generated little surface trap not influential to the responsivity with respect to the incoming-light of the short wavelength range. Therefore, the number of a generated carrier is increased and quantum efficiency is improved in the optoelectronic integrated circuit, the generated carrier being in the first through the third semiconductor layers and influencing responsivity. Accordingly, the optoelectronic integrated circuit achieves high quantum efficiency with respect to not only an incoming-light of the conventional long wavelength range but also the incoming-light of the short wavelength range.

BRIEF DESCRIPTION OF THE DRAWINGS

Preferred embodiments of the present invention will be described in detail with reference to the following drawings, wherein:

FIG. 5A through FIG. 5F illustrate a flow diagram of a first manufacturing method of a semiconductor photo detecting element in accordance with the first embodiment;

FIG. 6A through FIG. 6F illustrate a flow diagram of a second manufacturing method of a semiconductor photo detecting element in accordance with the first embodiment;

FIG. 7A through FIG. 7F illustrate a flow diagram of a third manufacturing method of a semiconductor photo detecting element in accordance with the first embodiment;

FIG. 9A through FIG. 9H illustrate a flow diagram of a manufacturing method of a semiconductor photo detecting element in accordance with a second embodiment of the present invention;

FIG. 13A through FIG. 13E illustrate a flow diagram of a manufacturing method of an optoelectronic integrated circuit.

DESCRIPTION OF THE PREFERRED EMBODIMENTS

A description will now be given, with reference to the accompanying drawings, of embodiments of the present invention.

First Embodiment

Figure 1:
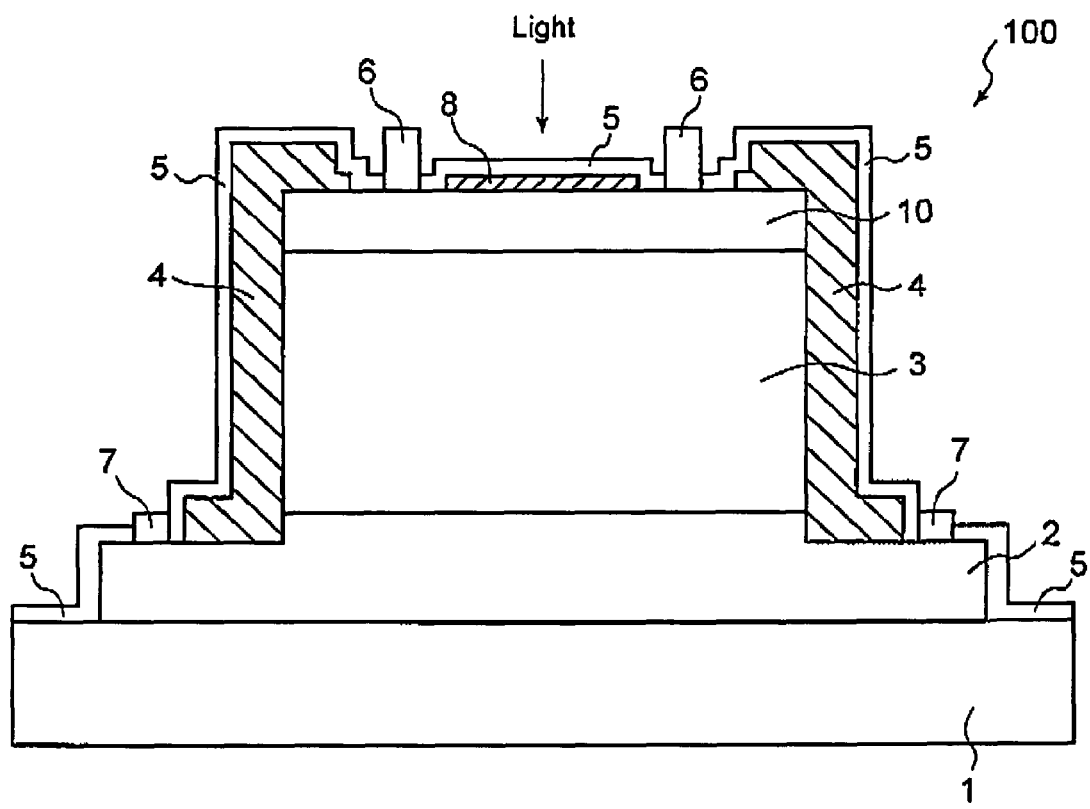
FIG. 1 illustrates a schematic cross sectional view of a semiconductor photo detecting element in accordance with a first embodiment of the present invention.

FIG. 1 illustrates a schematic cross sectional view of a semiconductor photo detecting element 100 in accordance with a first embodiment of the present invention. As shown in FIG. 1, the semiconductor photo detecting element 100 has a structure in which an n-type semiconductor layer 2, a first i-type semiconductor layer 3 and a p-type semiconductor layer 10 are laminated on a semiconductor substrate 1 in order. The first i-type semiconductor layer 3 and the p-type semiconductor layer 10 have a mesa shape and compose a first mesa portion having a circular cylinder shape. The n-type semiconductor layer 2 has a mesa shape and composes a second mesa portion that is provided under a bottom face of the first mesa portion and has a truncated cone shape. The second mesa portion has a bottom face larger than that of the first mesa portion.

An n-type electrode 7 is provided on an area of the second mesa portion that is except for the first mesa portion and is separated away from the first i-type semiconductor layer 3. The n-type electrode 7 is ohmically contacted to the n-type semiconductor layer 2. A p-type electrode 6 having a ring shape is provided on the first mesa portion. The p-type electrode 6 is ohmically contacted to the p-type semiconductor layer 10. A second i-type semiconductor layer 8 is provided on the p-type semiconductor layer 10 inside of the p-type electrode 6.

A semiconductor layer 4 is provided from on the n-type electrode 7 to on the p-type electrode 6. That is, the semiconductor layer 4 is provided from on the n-type semiconductor layer 2 to on an upper face of the p-type semiconductor layer 10 passing on a side face of the first i-type semiconductor layer 3 and the p-type semiconductor layer 10. A passivation insulating layer 5 covers an upper face of the semiconductor substrate 1, a side face of the n-type semiconductor layer 2, a surface of the semiconductor layer 4, the p-type semiconductor layer 10 and the second i-type semiconductor layer 8. However, the passivation insulating layer 5 has an opening on the n-type electrode 7 and on the p-type electrode 6.

The semiconductor substrate 1 is, for example, composed of InP. The n-type semiconductor layer 2 is composed of n-type InGaAs lattice-matched to the semiconductor substrate 1. The n-type semiconductor layer 2 has N-type carrier density of approximately $1 \times 10^{18}$ cm$^{-3}$. A dopant in the n-type semiconductor layer 2 is, for example, Si. The n-type semiconductor layer 2 has a thickness of approximately 1 µm. The first i-type semiconductor layer 3 is composed of substantially undoped InGaAs. Here, "substantially undoped" means a case where dopant is not doped intentionally. The first i-type semiconductor layer 3 has a thickness of approximately 2 µm.

The p-type semiconductor layer 10 is composed of p-type InGaAs. The p-type semiconductor layer 10 has a structure in which a first layer and a second layer are laminated in order, the first layer having P-type carrier density of $2 \times 10^{18}$ cm$^{-3}$ and having a thickness of 0.1 µm, the second layer having P-type carrier density of $1 \times 10^{19}$ cm$^{-3}$ and having a thickness of 0.2 µm. Dopant of the p-type semiconductor layer 10 is, for example, Zn. The second i-type semiconductor layer 8 is composed of substantially undoped InP. A thickness of the second i-type semiconductor layer 8 is described later. The semiconductor layer 4 is composed of substantially undoped InP. A thickness of the semiconductor layer 4 is described later.

The passivation insulating layer 5 is composed of an insulating material. Fluoride, oxide and nitride of silicon, aluminum and titanium are used for the insulating material composing the passivation insulating layer 5. In the embodiment, an insulator composed of SiN is used. The passivation insulating layer 5 on the second i-type semiconductor layer 8 acts as an antireflective layer.

Figure 2:
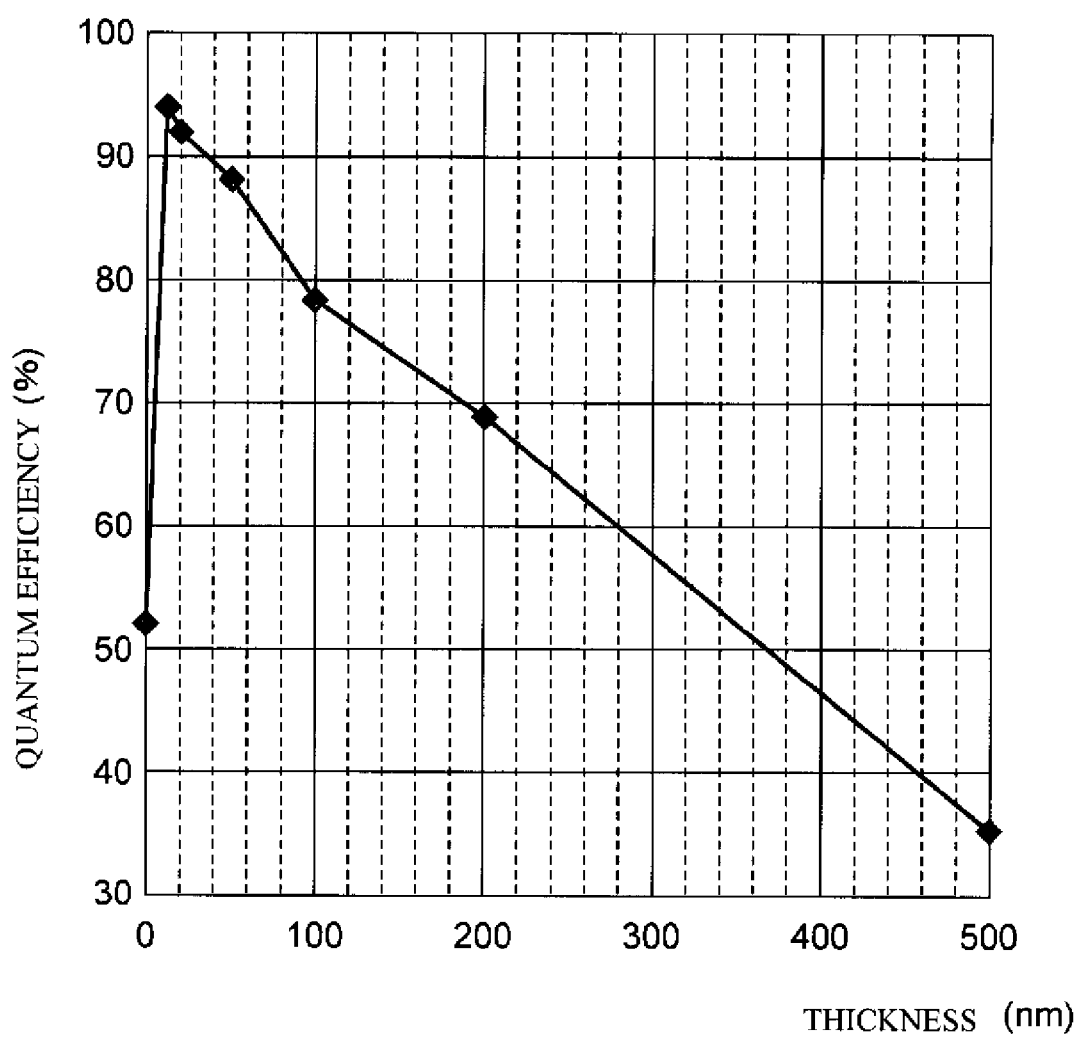
FIG. 2 illustrates a relationship between a thickness of a second i-type semiconductor (InP) layer and quantum efficiency of InGaAs in a case where a light having a wavelength of 850 nm is used as an incoming light, the second i-type semiconductor (InP) layer being provided on the InGaAs.
Figure 3:
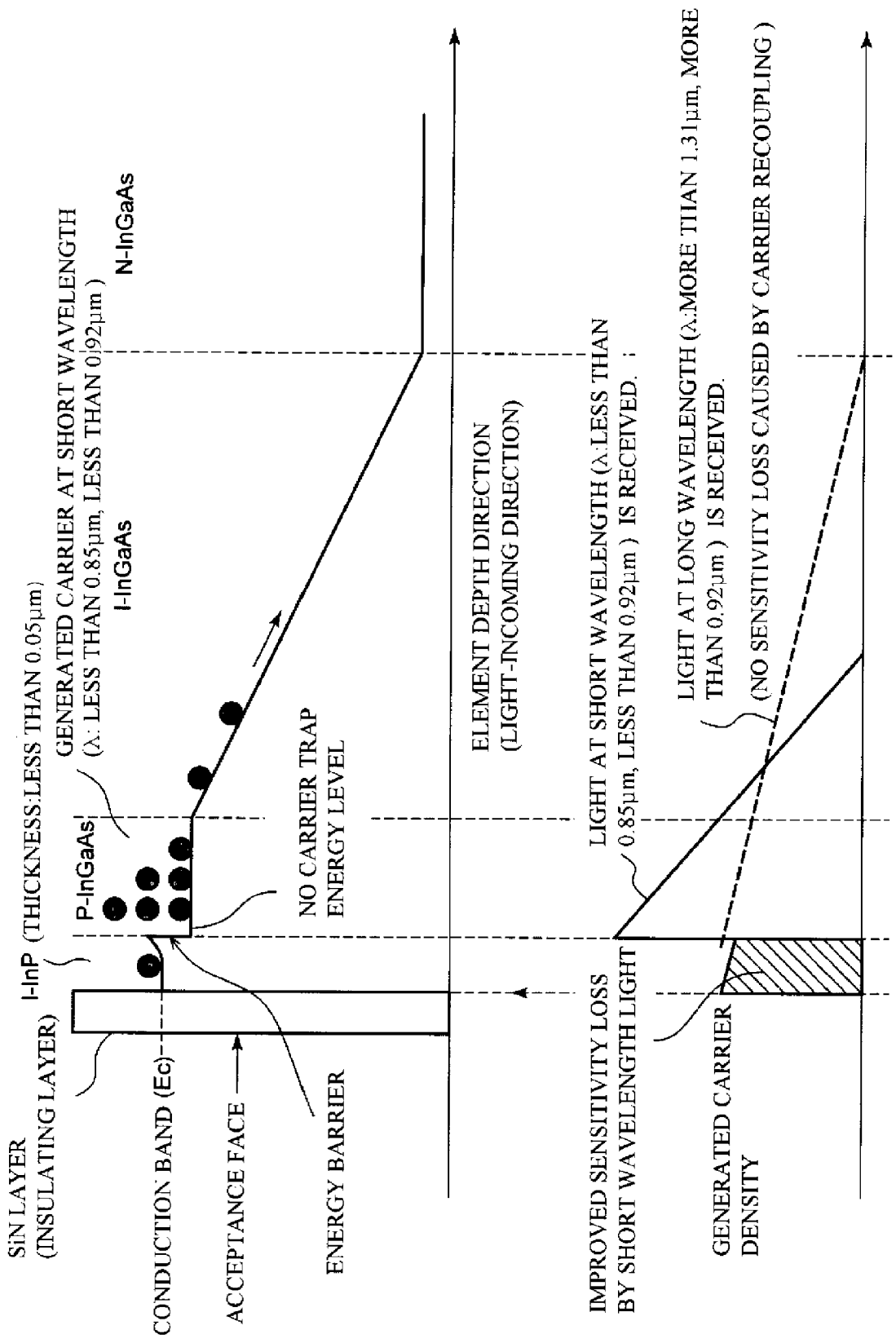
FIG. 3 illustrates a schematic diagram of band gap energy and a generated carrier density in a case where a second i-type semiconductor (InP) layer has a thickness of 5 nm to 50 nm.

Next, a description will be given of the thickness of the second i-type semiconductor layer 8 with reference to FIG. 2 and FIG. 3. FIG. 2 illustrates a relationship between the thickness of the second i-type semiconductor layer 8 and quantum efficiency of InGaAs in a case where a light having a wavelength of 850 nm is used as an incoming light, the second i-type semiconductor layer 8 being provided on an entrance face of the InGaAs. A horizontal axis of FIG. 2 indicates the thickness of the second i-type semiconductor layer 8. A vertical axis of FIG. 2 indicates quantum efficiency of InGaAs having the second i-type semiconductor layer 8 on the entrance face thereof. FIG. 3 illustrates a schematic diagram of band gap energy and a generated carrier density in a case where the second i-type semiconductor layer 8 has a thickness of 5 nm to 50 nm.

As shown in FIG. 2, the quantum efficiency of the InGaAs is approximately 50% in a case where the second i-type semiconductor layer 8 has a thickness of 0 nm. This is because the surface of InGaAs is unstable and there are many trap energy levels of the generated carrier on the surface of the InGaAs.

The quantum efficiency of InGaAs is above 80%, in a case where the second i-type semiconductor layer 8 has a thickness of 5 nm to 50 nm. In this case, the quantum efficiency of the semiconductor photo detecting element 100 is more than that of a silicon photodiode. This is because the number of the generated carriers in the second i-type semiconductor layer 8 is reduced in a case where the second i-type semiconductor layer 8 has a thickness of 5 nm to 50 nm, as shown in FIG. 3.

Therefore, the quantum efficiency of InGaAs is enlarged when the thickness of InP is 5 nm to 50 nm, even if InP has high absorption efficiency with respect to a short-wavelength light of less than 920 nm. And it is necessary that the second i-type semiconductor layer 8 in accordance with the embodiment has a thickness of 5 nm to 50 nm.

Figure 4:
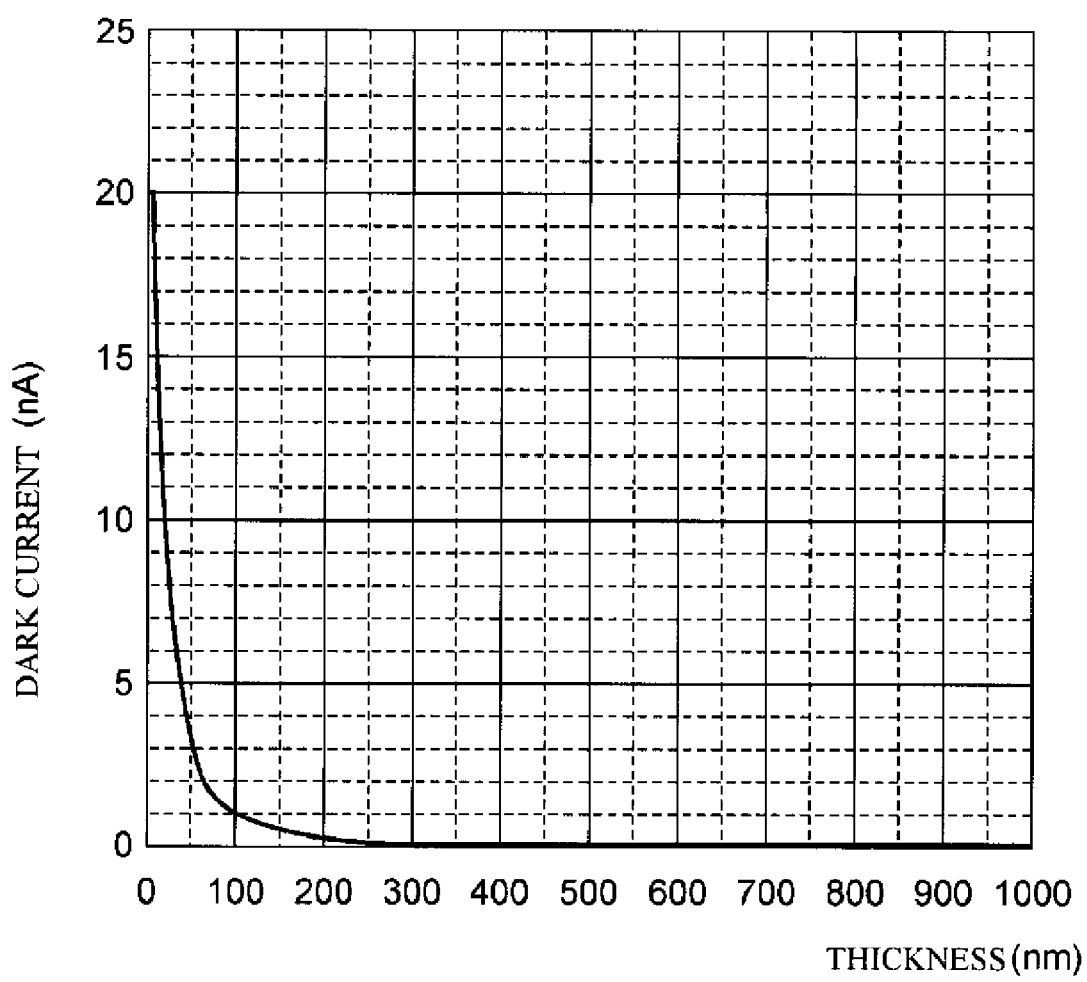
FIG. 4 illustrates a relationship between a thickness of a passivation semiconductor (InP) layer and dark current of a semiconductor photo detecting element.

Next, a description will be given of the thickness of the semiconductor layer 4 with reference to FIG. 4. FIG. 4 illustrates a relationship between the thickness of the semiconductor layer 4 and dark current of the semiconductor photo detecting element 100. A horizontal axis of FIG. 4 indicates the thickness of the semiconductor layer 4. A vertical axis of FIG. 4 indicates the dark current of the semiconductor photo detecting element 100. The thickness of the semiconductor layer 4 means a thickness in a case where the side face of the first mesa is a lamination plane.

As shown in FIG. 4, the dark current is large when the semiconductor layer 4 is thin. The dark current gets smaller when the semiconductor layer 4 gets thicker. The dark current is less than 1 nA, when the thickness of the semiconductor layer 4 is above 100 nm. In this case, the semiconductor photo detecting element 100 maintains high reliability. Therefore, it is necessary that the semiconductor layer 4 has a thickness of more than 100 nm.

In a correspondence relationship between the semiconductor photo detecting element 100 and the claims 1 and 4, the n-type semiconductor layer 2 corresponds to the first semiconductor layer; the first i-type semiconductor layer 3 corresponds to the second semiconductor layer; the p-type semiconductor layer 10 corresponds to the third semiconductor layer; the second i-type semiconductor layer 8 corresponds to the window semiconductor layer; and the semiconductor layer 4 corresponds to the protective semiconductor layer.

(Manufacturing Method 1-1)

Next, a description will be given of a manufacturing method of the semiconductor photo detecting element 100. FIG. 5A through FIG. 5F illustrate a flow diagram of a first manufacturing method of the semiconductor photo detecting element 100. As shown in FIG. 5A, the n-type semiconductor layer 2, the first i-type semiconductor layer 3, the p-type semiconductor layer 10 and the second i-type semiconductor layer 8 are grown on the semiconductor substrate 1 epitaxially. Next, as shown in FIG. 5B, a surrounding portion of the second i-type semiconductor layer 8 is subjected to a selective etching treatment. And the second i-type semiconductor layer 8 is formed circular cylindrical in shape.

Next, as shown in FIG. 5C, a surrounding portion of the first i-type semiconductor layer 3 and the p-type semiconductor layer 10 is subjected to a selective etching treatment. And the first mesa is formed. The bottom face of the first mesa is larger than that of the second i-type semiconductor layer 8. The second i-type semiconductor layer 8 is thus inside of the upper face of the first mesa. Next, as shown in FIG. 5D, a selective growth mask is provided on a whole of the upper face of the second i-type semiconductor layer 8 and the p-type semiconductor layer 10 and on a part of the upper face of the n-type semiconductor layer 2. After that, the semiconductor layer 4 is grown on the n-type semiconductor layer 2 and the side face of the first mesa epitaxially. After that, the selective growth mask is eliminated.

Next, as shown in FIG. 5E, the passivation insulating layer 5 is grown on an exposed face of the second i-type semiconductor layer 8 and on an exposed face of the semiconductor layer 4. Next, as shown in FIG. 5F, the n-type electrode 7 is formed on an exposed face of the n-type semiconductor layer 2, and the p-type electrode 6 is formed on an exposed face of the p-type semiconductor layer 10. With the process, the semiconductor photo detecting element 100 is manufactured.

In the process mentioned above, it is not necessary to grow another semiconductor layer on the second i-type semiconductor layer 8, because the second i-type semiconductor layer 8 is formed in the first epitaxial growth process and a semiconductor layer is grown epitaxially only on the side face of the first mesa after the second i-type semiconductor layer 8 is protected with the selective growth mask. In this case, a regrown interface is not formed on the second i-type semiconductor layer 8. Therefore, the second i-type semiconductor layer 8 may be used as a photo detecting window having a sensitive face. In the manufacturing method mentioned above, it is not necessary to form a ring-shaped contact hole in the second i-type semiconductor layer 8. A distance between an end of the first mesa and the contact electrode gets longer. As a result, a diameter of the first mesa determining a capacity is reduced. The semiconductor photo detecting element manufactured with the manufacturing method 1-1 achieves the effect of the present invention, although the upper part of the mesa of the semiconductor photo detecting element is different from that of the semiconductor photo detecting element 100.

In a correspondence relationship between the manufacturing method 1-1 and the claim 12, the n-type semiconductor layer 2 corresponds to the first semiconductor layer; the first i-type semiconductor layer 3 corresponds to the second semiconductor layer; the p-type semiconductor layer 10 corresponds to the third semiconductor layer; the second i-type semiconductor layer 8 corresponds to the fourth semiconductor layer; and the semiconductor layer 4 corresponds to the fifth semiconductor layer.

(Manufacturing method 1-2)

FIG. 6A through FIG. 6F illustrate a flow diagram of a second manufacturing method of the semiconductor photo detecting element 100. As shown in FIG. 6A, the n-type semiconductor layer 2, the first i-type semiconductor layer 3 and the p-type semiconductor layer 10 are grown on the semiconductor substrate 1 epitaxially. Next, as shown in FIG. 6B, a surrounding portion of the p-type semiconductor layer 10 and the first i-type semiconductor layer 3 are subjected to a selective etching treatment. And the first mesa is formed.

Next, as shown in FIG. 6C, the semiconductor layer 4 is grown epitaxially so as to cover the n-type semiconductor layer 2 and the first mesa. Then, as shown in FIG. 6D, the semiconductor layer 4 on the p-type semiconductor layer 10 is subjected to an etch-back treatment. And the second i-type semiconductor layer 8 having a desirable thickness is formed. Next, as shown in FIG. 6E, the passivation insulating layer 5 is grown so as to cover the semiconductor layer 4 and the second i-type semiconductor layer 8. A contact hole is formed in a part of the n-type semiconductor layer 2 and in a part of the p-type semiconductor layer 10.

Next, as shown in FIG. 6F, the n-type electrode 7 is formed on an exposed area of the n-type semiconductor layer 2. The p-type electrode 6 is formed on an exposed area of the p-type semiconductor layer 10. With the processes, the semiconductor photo detecting element 100 is manufactured. It is therefore possible to form the semiconductor layer 4 and the second i-type semiconductor layer 8 in one process. Therefore, the manufacturing process is simplified. And it is not necessary to grow another semiconductor layer on the second i-type semiconductor layer 8. In this case, a regrown interface is not formed on the second i-type semiconductor layer 8. Therefore, the second i-type semiconductor layer 8 may be used as a photo detecting window having a sensitive face.

In a correspondence relationship between the manufacturing method 1-2 and the claim 14, the n-type semiconductor layer 2 corresponds to the first semiconductor layer; the first i-type semiconductor layer 3 corresponds to the second semiconductor layer; the p-type semiconductor layer 10 corresponds to the third semiconductor layer; and the second i-type semiconductor layer 8 corresponds to the fourth semiconductor layer.

(Manufacturing Method 1-3)

FIG. 7A through FIG. 7F illustrate a flow diagram of a third manufacturing method of the semiconductor photo detecting element 100. As shown in FIG. 7A, the n-type semiconductor layer 2, the first i-type semiconductor layer 3 and the p-type semiconductor layer 10 are grown on the semiconductor substrate 1 epitaxially. Next, as shown in FIG. 7B, a surrounding portion of the p-type semiconductor layer 10 and the first i-type semiconductor layer 3 are subjected to a selective etching treatment. And the first mesa is formed.

Next, as shown in FIG. 7C, a selective growth mask is provided on a whole of the upper face of the p-type semiconductor layer 10 and on a part of the upper face of the n-type semiconductor layer 2. After that, the semiconductor layer 4 is grown on the side face of the first mesa epitaxially. After that, the selective growth mask is eliminated. Then, as shown in FIG. 7D, a selective growth mask is provided so as to cover the semiconductor layer 4 and the n-type semiconductor layer 2. After that, the second i-type semiconductor layer 8 is grown on the p-type semiconductor layer 10 epitaxially. After that, the selective growth mask is eliminated.

Next, as shown in FIG. 7E, the passivation insulating layer 5 is grown so as to cover the n-type semiconductor layer 2, the semiconductor layer 4, the p-type semiconductor layer 10 and the second i-type semiconductor layer 8. A contact hole is formed so that a part of the n-type semiconductor layer 2 and a part of the p-type semiconductor layer 10 are exposed. Next, as shown in FIG. 7F, the n-type electrode 7 is formed on an exposed area of the n-type semiconductor layer 2. The p-type electrode 6 is formed on an exposed area of the p-type semiconductor layer 10. With the processes, the semiconductor photo detecting element 100 is manufactured.

In this case, a thermal influence to the second i-type semiconductor layer 8 is reduced in a following process, because the second i-type semiconductor layer 8 is formed after the epitaxial growth on the side face of the first mesa. That is, the second i-type semiconductor layer 8 is not subjected to a process of epitaxial growth of a semiconductor layer of which temperature is the highest in the manufacturing process. And it is not necessary to grow another semiconductor layer on the second i-type semiconductor layer 8. In this case, a regrown interface is not formed on the second i-type semiconductor layer 8. Therefore, the second i-type semiconductor layer 8 may be used as a photo detecting window having a sensitive face. The semiconductor photo detecting element manufactured with the manufacturing method 1-3 achieves the effect of the present invention, although the upper part of the mesa of the semiconductor photo detecting element is different from that of the semiconductor photo detecting element 100.

In a correspondence relationship between the manufacturing method 1-3 and the claim 16, the n-type semiconductor layer 2 corresponds to the first semiconductor layer; the first i-type semiconductor layer 3 corresponds to the second semiconductor layer; the p-type semiconductor layer 10 corresponds to the third semiconductor layer; the semiconductor layer 4 corresponds to the fourth semiconductor layer; and the second i-type semiconductor layer 8 corresponds to the fifth semiconductor layer.

Second Embodiment

Figure 8:
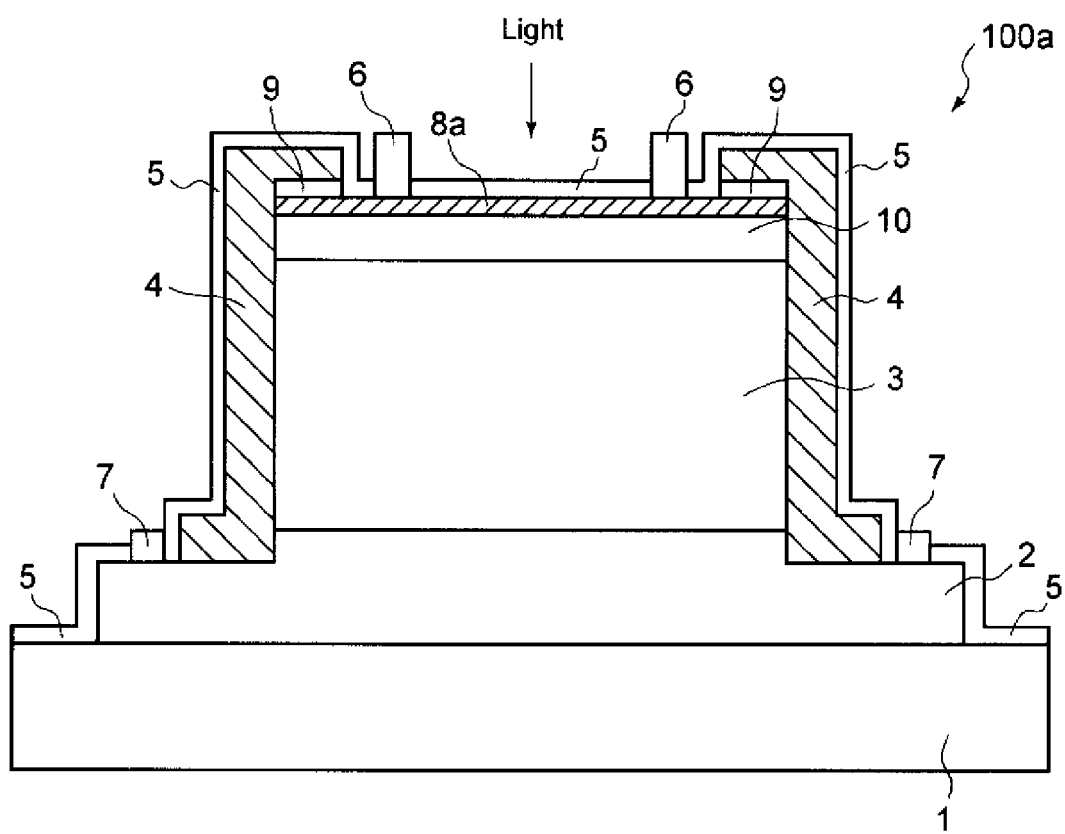
FIG. 8 illustrates a schematic cross sectional view of a semiconductor photo detecting element in accordance with a second embodiment of the present invention.

Next, a description will be given of a semiconductor photo detecting element 100a in accordance with a second embodiment of the present invention. FIG. 8 illustrates a schematic cross sectional view of the semiconductor photo detecting element 100a. As shown in FIG. 8, the semiconductor photo detecting element 100a is different from the semiconductor photo detecting element 100 in a point that a second p-type semiconductor layer 8a is provided instead of the second i-type semiconductor layer 8. The second p-type semiconductor layer 8a is formed on a whole of the upper face of the p-type semiconductor layer 10. The p-type electrode 6 is ohmically contacted to the second p-type semiconductor layer. The second p-type semiconductor layer 8a is composed of InP. The second p-type semiconductor layer 8a has P-type carrier density of $2 \times 10^{18}$ cm$^{-3}$.

The second p-type semiconductor layer 8a has a thickness of 5 nm to 50 nm. Therefore, the semiconductor photo detecting element 100a has quantum efficiency of more than 80% with respect to a short-wavelength light of less than 920 nm. The semiconductor layer 4 has a thickness of more than 100 nm. Therefore, the semiconductor photo detecting element 100a has a dark current of less than 1 nA. In this case, the semiconductor photo detecting element 100a maintains high reliability.

(Manufacturing Method 2-1)

Next, a description will be given of a manufacturing method of the semiconductor photo detecting element 10a. FIG. 9A through FIG. 9H illustrate a flow diagram of a manufacturing method of the semiconductor photo detecting element 100a. As shown in FIG. 9A, the n-type semiconductor layer 2, the first i-type semiconductor layer 3, the p-type semiconductor layer 10, the second p-type semiconductor layer 8a and an InGaAs cover layer 9 are grown on the semiconductor substrate 1 epitaxially. Next, as shown in FIG. 9B, a surrounding portion of the second p-type semiconductor layer 8a and the InGaAs cover layer 9 are subjected to a selective etching treatment.

Next, as shown in FIG. 9C, a surrounding portion of the first i-type semiconductor layer 3 and the p-type semiconductor layer 10 is subjected to a selective etching treatment. And the first mesa is formed. A diameter of the first mesa is larger than that of the second p-type semiconductor layer 8a and the InGaAs cover layer 9. The second p-type semiconductor layer 8a and the InGaAs cover layer 9 are thus inside on the upper face of the first mesa.

Next, as shown in FIG. 9D, the semiconductor layer 4 is grown epitaxially so as to cover the n-type semiconductor layer 2, the first mesa, the second p-type semiconductor layer 8a and the InGaAs cover layer 9. Then, as shown in FIG. 9E, the semiconductor layer 4 on a part of the n-type semiconductor layer 2 and on the InGaAs cover layer 9 is eliminated.

Next, as shown in FIG. 9F, a contact hole is formed in a part of the InGaAs cover layer 9. Then, as shown in FIG. 9G, the passivation insulating layer 5 is formed so as to cover the semiconductor layer 4. Next, as shown in FIG. 9H, the p-type electrode 6 is formed on an exposed area of the second p-type semiconductor layer 8a. The n-type electrode 7 is formed on an exposed area of the n-type semiconductor layer 2. With the processes, the semiconductor photo detecting element 100a is manufactured.

In accordance with the manufacturing method shown in FIG. 9A through 9H, it is not necessary to perform a selective epitaxial growth process. It is not necessary to control the thickness with an etch-back treatment. It is possible to structure a process of forming an element with relatively simple unit process. The effect of the present invention is obtained even if a semiconductor layer of InP is provided instead of the second i-type semiconductor layer 8.

In a correspondence relationship between the semiconductor photo detecting element 100a and the claims 1 and 4, the n-type semiconductor layer 2 corresponds to the first semiconductor layer; the first i-type semiconductor layer 3 corresponds to the second semiconductor layer; the p-type semiconductor layer 10 corresponds to the third semiconductor layer; the second p-type semiconductor layer 8a corresponds to the window semiconductor layer; and the semiconductor layer 4 corresponds to the protective semiconductor layer.

Third Embodiment

Figure 10:
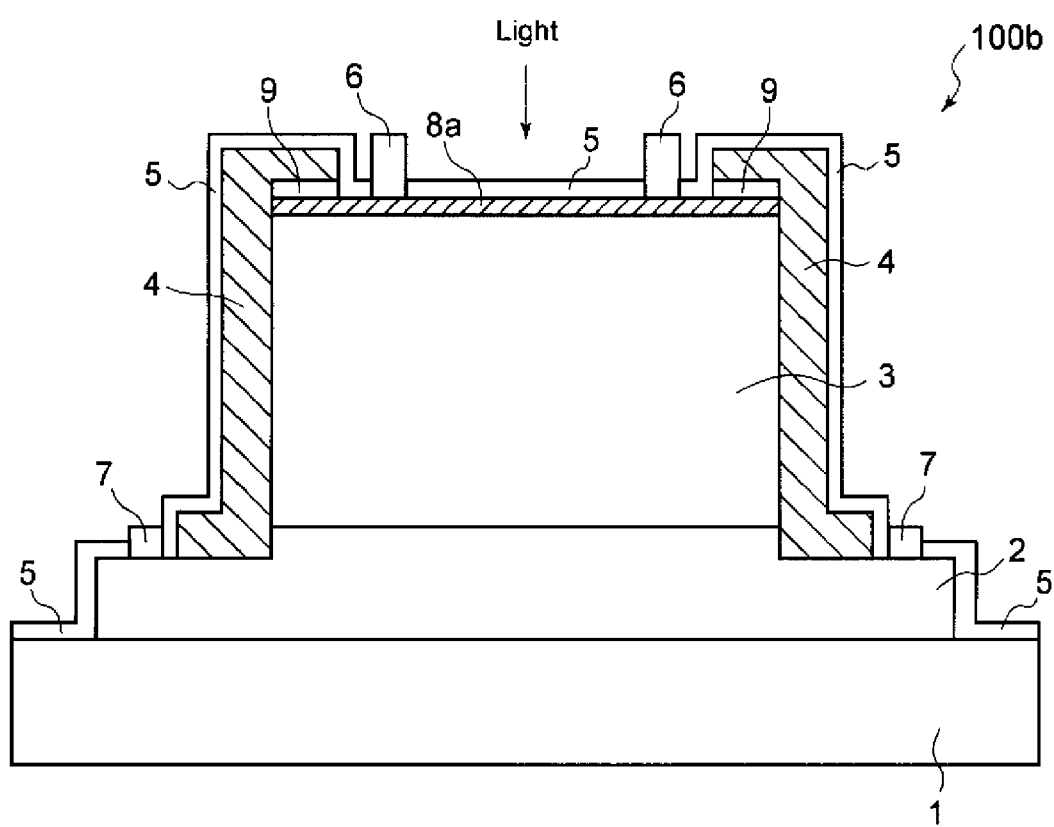
FIG. 10 illustrates a schematic cross sectional view of a semiconductor photo detecting element in accordance with a third embodiment of the present invention.

Next, a description will be given of a semiconductor photo detecting element 100b in accordance with a third embodiment of the present invention. FIG. 10 illustrates a schematic cross sectional view of the semiconductor photo detecting element 100b. As shown in FIG. 10, the semiconductor photo detecting element 100b is different from the semiconductor photo detecting element 100 in a point that the second p-type semiconductor layer 8a is provided instead of the second i-type semiconductor layer 8 and the p-type semiconductor layer 10 is omitted. In this case, it is possible that a carrier (hole) is delayed at a hetero interface between the first i-type semiconductor layer 3 and the second p-type semiconductor layer 8a because of an energy potential differential. An InGaAs intermediate layer may be provided at the hetero interface between the first i-type semiconductor layer 3 and the second p-type semiconductor layer 8a. In this case, the InGaAs intermediate layer may be composed of an upper layer and a lower layer, the upper layer contacting to the second p-type semiconductor layer 8a composed of InP and having PL wavelength of 1.1 µm, the lower layer contacting to the first i-type semiconductor layer 3 and having PL wavelength of 1.3 µm.

The second p-type semiconductor layer 8a has a thickness of 5 nm to 50 nm. And the semiconductor photo detecting element 100b has quantum efficiency of more than 80% with respect to a short-wavelength light of less than 920 nm. And the semiconductor layer 4 has a thickness of more than 100 nm. Thus, the semiconductor photo detecting element 100b has a dark current of less than 1 nA. Therefore, the semiconductor photo detecting element 100b maintains high reliability.

In a correspondence relationship between the semiconductor photo detecting element 100b and the claim 3, the n-type semiconductor layer 2 corresponds to the first semiconductor layer; the first i-type semiconductor layer 3 corresponds to the second semiconductor layer; the second p-type semiconductor layer 8a corresponds to the third semiconductor layer.

Fourth Embodiment

Figure 11:
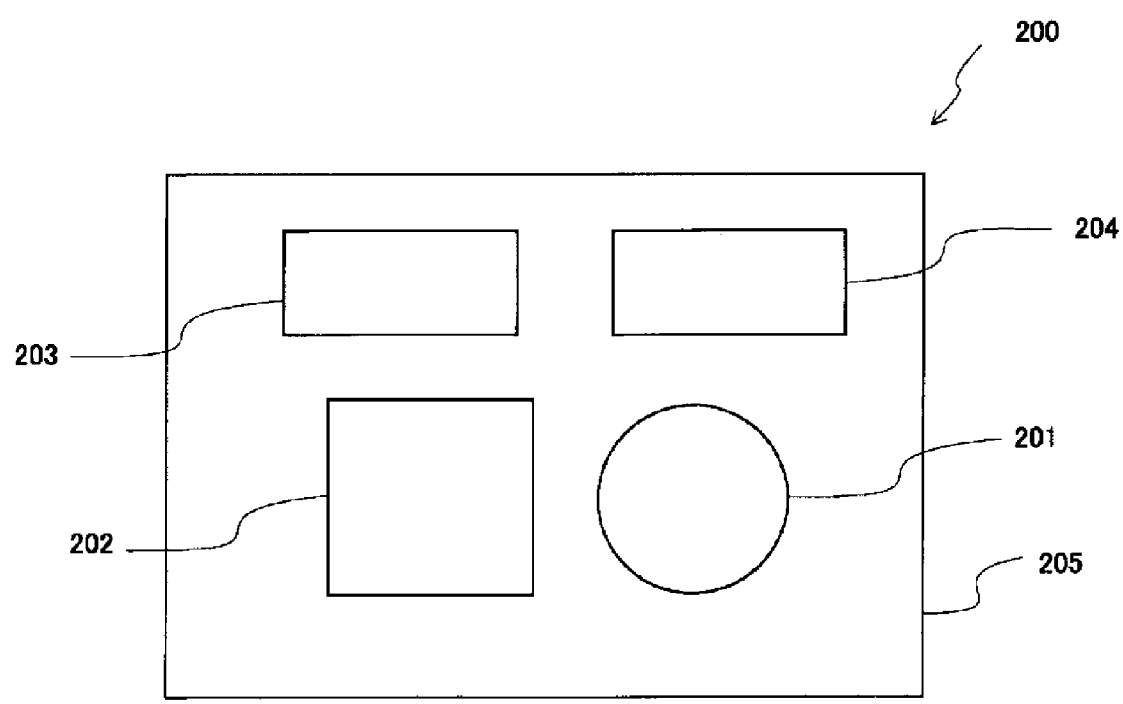
FIG. 11 illustrates a top view of an optoelectronic integrated circuit in accordance with a fourth embodiment of the present invention.

Next, a description will be given of a optoelectronic integrated circuit 200 in accordance with a fourth embodiment of the present invention. FIG. 11 illustrates a top view of the optoelectronic integrated circuit 200. As shown in FIG. 11, the optoelectronic integrated circuit 200 has a structure in which a semiconductor photo detecting element 201 acting as a photo detecting element, HBTs (hetero junction bipolar transistors) 202 acting as electronic device elements, resistors 203 and capacitors 204 are integrated on a semiconductor substrate 205 monolithically. The semiconductor photo detecting element 201 is one of the semiconductor photo detecting elements 100, 100a and 100b.

Figure 12:
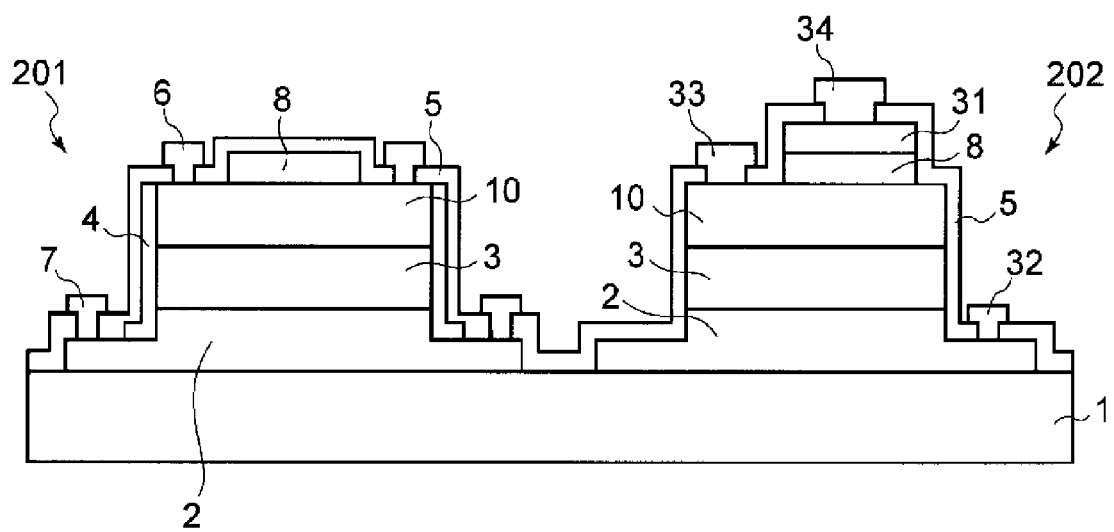
FIG. 12 illustrates a schematic cross sectional view of a semiconductor photo detecting element and an HBT in accordance with the fourth embodiment of the present invention.

FIG. 12 illustrates a schematic cross sectional view of the semiconductor photo detecting element 201 and the HBT 202. As shown in FIG. 12, the HBT 202 has a structure in which the n-type semiconductor layer 2, the first i-type semiconductor layer 3 and the p-type semiconductor layer 10 are laminated on the semiconductor substrate 1 in order. The first i-type semiconductor layer 3 and the p-type semiconductor layer 10 have a mesa shape, and integrally compose a third mesa portion having a truncated cone shape. The n-type semiconductor layer 2 has a mesa shape, and composes a fourth mesa portion that is provided under a bottom face of the third mesa portion and has a truncated cone shape. The fourth mesa portion has a diameter larger than that of the third mesa portion.

The second i-type semiconductor layer 8 and a second n-type semiconductor layer 31 are provided on the third mesa portion, have a mesa shape, and compose a fifth mesa portion having a truncated cone. The fifth mesa portion has a diameter smaller than that of the third mesa portion. The passivation insulating layer 5 is provided on a side face of the third through the fifth mesa portions. A collector electrode 32 is provided on the n-type semiconductor layer 2. A base electrode 33 is provided on the p-type semiconductor layer 10. An emitter electrode 34 is provided on the second n-type semiconductor layer 31.

(Manufacturing Method 4-1)

Next, a description will be given of a manufacturing method of the optoelectronic integrated circuit 200. FIG. 13A through FIG. 13E illustrate a flow diagram of the manufacturing method of the optoelectronic integrated circuit 200. As shown in FIG. 13A, the n-type semiconductor layer 2, the first i-type semiconductor layer 3, the p-type semiconductor layer 10, the second i-type semiconductor layer 8 and the second n-type semiconductor layer 31 are grown on the semiconductor substrate 1 epitaxially. Next, as shown in FIG. 13B, a region A and a region B are formed with a selective etching treatment, the region A being composed of the first mesa portion, the second mesa portion and the second i-type semiconductor layer 8, the region B being composed of the third through the fifth mesa portions. Then, as shown in FIG. 13C, the semiconductor layer 4 is grown epitaxially on a side face of the first i-type semiconductor layer 3 and the p-type semiconductor layer 10 in the region A. Next, as shown in FIG. 13D, the passivation insulating layer 5 is formed on the semiconductor layer 4, the second i-type semiconductor layer 8 in the region A, the n-type semiconductor layer 2 in the region B, a side face of the first i-type semiconductor layer 3 and the p-type semiconductor layer 10, and a side face of the second i-type semiconductor layer 8 and the second n-type semiconductor layer 31.

Then, as shown in FIG. 13E, the n-type electrode 7 is formed on an exposed area of the n-type semiconductor layer 2 in the region A. The p-type electrode 6 is formed on an exposed area of the p-type semiconductor layer 10 in the region A. The collector electrode 32 is formed on an exposed area of the n-type semiconductor layer 2 in the region B. The base electrode 33 is formed on an exposed area of the p-type semiconductor layer 10 in the region B. The emitter electrode 34 is formed on an exposed area of the second n-type semiconductor layer 31. With the processes, the optoelectronic integrated circuit 200 is manufactured.

In accordance with the manufacturing method in FIG. 13A through FIG. 13E, it is possible to commoditize the epitaxial growth layer in the photo detecting element and the epitaxial growth layer in the electronic device elements. And it is possible to commoditize the processes of forming the photo detecting element and forming the electronic device elements. And it is possible to simplify the integrating process.

A p-type semiconductor layer, an i-type semiconductor layer and an n-type semiconductor layer may be laminated in order, although the n-type semiconductor layer, the i-type semiconductor layer and the p-type semiconductor layer are laminated on the semiconductor substrate in order in the semiconductor photo detecting element in accordance with the above embodiments. The semiconductor photo detecting element is not limited to be of the InP/InGaAs type. The semiconductor photo detecting element may be of a GaAs/AlGaAs type.

In a correspondence relationship between the optoelectronic integrated circuit 200 and the claim 18, the n-type semiconductor layer 2 corresponds to the first semiconductor layer; the first i-type semiconductor layer 3 corresponds to the second semiconductor layer; the p-type semiconductor layer 10 corresponds to the third semiconductor layer; the second i-type semiconductor layer 8 corresponds to the fourth semiconductor layer; the second n-type semiconductor layer 31 corresponds to the fifth semiconductor layer; and the semiconductor layer 4 corresponds to the sixth semiconductor layer.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-182325 filed on Jun. 30, 2006, the entire disclosure of which is hereby incorporated by reference.

What is claimed is:

1. A semiconductor photo detecting element comprising:
   a PIN-type photo detecting element having a semiconductor substrate, a first semiconductor layer, a second semiconductor layer and a third semiconductor layer,
   the first through the third semiconductors layer being composed of InGaAs,
   the first semiconductor layer being provided on the semiconductor substrate, being lattice-matched to the semiconductor substrate, including a first conductivity type dopant, and having first band gap energy,
   the second semiconductor layer being provided on the first semiconductor layer, having the first band gap energy, and having a concentration of the first conductivity type dopant lower than that of the first semiconductor layer or being substantially undoped,
   the third semiconductor layer being provided on the second semiconductor layer, having the first band gap energy, and having a concentration of a second conductivity type dopant;
   a window semiconductor layer that is composed of InP, has second band gap energy larger than the first band gap energy at a light-incoming side with respect to the second semiconductor layer and has a thickness of 5 nm to 50 nm,
   the light passing through the window semiconductor layer;
   a protective semiconductor layer that is composed of InP, is provided on a side face of the first through the third semiconductor layers, has the second band gap energy, and has a thickness of more than 100 nm; and
   a passivation insulating layer being provided on the window semiconductor layer and the protective semiconductor layer.

2. The semiconductor photo detecting element as claimed in claim 1, further comprising an electrode on the third semiconductor layer or on the window semiconductor layer.

3. The semiconductor photo detecting element as claimed in claim 1, wherein thickness differential between the protective semiconductor layer and the window semiconductor layer is more than 50 nm.

4. The semiconductor photo detecting element as claimed in claim 2 further comprising an electrode either on an upper face of the first semiconductor layer or on a bottom face of the semiconductor substrate.

5. The semiconductor photo detecting element as claimed in claim 1 further comprising at least one of electronic device elements, capacitors and resistors integrated monolithically.

6. The semiconductor photo detecting element as claimed in claim 5, wherein the electronic device element is a hetero junction bipolar transistor.

7. A semiconductor photo detecting element comprising:
   a PiN-type photo detecting element having a semiconductor substrate, a first semiconductor layer, a second semiconductor layer,
   the first and the second semiconductors layers being composed of InGaAs,
   the first semiconductor layer being provided on the semiconductor substrate, being lattice-matched to the semiconductor substrate, including a first conductivity type dopant, and having first band gap energy,
   the second semiconductor layer being provided on the first semiconductor layer, having the first band gap energy, and having a concentration of the first conductivity type dopant lower than that of the first semiconductor layer or being substantially undoped,
   a window semiconductor layer that is composed of InP, has second band gap energy larger than the first band gap energy at a light-incoming side with respect to the second semiconductor layer, has a concentration of a second conductivity dopant, and has a thickness of 5 nm to 50 nm,
   the light passing through the window semiconductor layer;
   a protective semiconductor layer that is composed of InP, is provided on a side face of the first semiconductor layer through the window semiconductor layers, has the second band gap energy, and has a thickness of more than 100 nm; and
   a passivation insulating layer being provided on the window semiconductor layer and the protective semiconductor layer.

8. The semiconductor photo detecting element as claimed in claim 7, wherein thickness difference between the protective semiconductor layer and the window semiconductor layer is more than 50 nm.

9. The semiconductor photo detecting element as claimed in claim 7 further comprising at least one of electronic device elements, capacitors and resistors integrated monolithically.

10. The semiconductor photo detecting element as claimed in claim 9, wherein the electronic device element is a hereto junction bipolar transistor.

* * * * *